United States Patent [19]

Barth

[11] 3,898,568

[45] Aug. 5, 1975

[54] SIGNAL SYNTHESIZER EMPLOYING AN AUTOTRANSFORMER HAVING A TAPPED COIL

[75] Inventor: Seymour Barth, Searingtown, N.Y.

[73] Assignee: Astrosystems, Inc., Lake Success, N.Y.

[22] Filed: June 7, 1974

[21] Appl. No.: 477,261

Related U.S. Application Data

[63] Continuation of Ser. No. 288,995, Sept. 14, 1972, Pat. No. 3,849,774.

[52] U.S. Cl............. 328/14; 307/229; 340/347 DA; 340/347 SY

[51] Int. Cl....................... H03b 19/00; H05k 13/02

[58] Field of Search................ 328/14, 27; 307/229; 340/347 DA, 347 SY; 318/605, 603, 608; 235/150.53, 154, 152, 186, 197

[56] References Cited

UNITED STATES PATENTS

| | | | |
|---|---|---|---|
| 2,814,006 | 11/1957 | Wilde | 340/347 DA |
| 2,969,489 | 1/1961 | Spencer et al. | 340/347 DA |
| 3,177,423 | 4/1965 | Fuldner | 318/605 |
| 3,196,430 | 7/1965 | Oken et al. | 340/347 DA |
| 3,335,417 | 8/1967 | Adler et al. | 340/347 SY |
| 3,375,513 | 3/1968 | Elbling | 235/186 |
| 3,500,213 | 3/1970 | Ameau | 328/14 |
| 3,505,669 | 4/1970 | Welch | 340/347 SY |
| 3,537,099 | 10/1970 | Johansson | 340/347 SY |
| 3,662,379 | 5/1972 | Miller et al. | 340/347 SY |

*Primary Examiner*—Stanley D. Miller, Jr.
*Attorney, Agent, or Firm*—Stevens, Davis, Miller & Mosher

[57] ABSTRACT

An analog-to-digital converter system for generating a high-resolution digital output corresponding to the position of a rotatable shaft by the use of digital techniques and components. The system employs a resolver having a receiver coupled to compensating and rotor windings thereof for providing a digital output corresponding to the angular position of the rotor with respect to the compensating winding. Excitation voltages are applied to the two input windings of the resolver by a voltage generator comprising an autotransformer having a plurality of sinusoidally distributed taps, a first switching unit for applying a voltage of appropriate polarity across the autotransformer and a second switching unit for coupling voltages at the taps of the autotransformer to the resolver input windings. The voltages applied across the resolver input windings have fundamental frequency components which are precisely in phase quadrature and have low harmonic content.

11 Claims, 2 Drawing Figures

SIGNAL SYNTHESIZER EMPLOYING AN AUTOTRANSFORMER HAVING A TAPPED COIL

This is a continuation, of application Ser. No. 288,995, filed Sept. 14, 1972, now U.S. Pat. No. 3,849,774.

BACKGROUND OF THE INVENTION

This invention relates to analog-to-digital converters and, in particular, to apparatus for generating with a high degree of accuracy and resolution a digital output corresponding to the position of a rotatable shaft.

There are many applications which require the generation of a precise indication in digital form of the angular position of a shaft. The electromagnetic induction-type resolver, having a pair of orthogonally oriented stator windings and a rotor winding which is coupled to the shaft and may be angularly displaced with respect to the stator windings, is well suited for such applications. The stator windings of the resolver may be energized by sinusoidal voltages which are in phase quadrature. Square-wave excitation may also be employed and is advantageous, as compared to sinusoidal excitation, in that it is easier to generate an accurate square-wave with the desired phase and amplitude; however, it has the disadvantage that a square-wave contains many harmonics of the fundamental frequency which adversely affect the resolution of the digital output signal.

It is an object of my invention to provide an analog-to-digital converter system employing a resolver wherein the resolver excitation voltage is generated by the use of digital techniques and commercially available digital logic components yet has such a low harmonic content that a high degree of accuracy may be obtained from the digital output. Further, a plurality of resolver channels can be excited by the same voltage generating components and the digital output of each channel read simultaneously without resorting to multiplexing and its associated switching problems. Each position of the resolver provides a unique digital output and, if power is lost and then restored, the output upon restoration will correspond to the position of the resolver shaft at the time of power restoration.

SUMMARY OF THE INVENTION

In accordance with the invention, an analog-to-digital converter is provided which comprises an electromagnetic transducer having at least first and second input windings and an output winding which is movable with respect to the input windings, a voltage generator for providing excitation voltage for the transducer input windings and a receiver for providing a digital output signal corresponding to the position of the transducer output winding relative to the input windings.

More specifically, the electromagnetic transducer may be a resolver wherein the first and second windings are in space quadrature with each other and the output winding is mounted on a shaft for rotation with respect to the input windings. If a voltage $$V_s = V\sin 2\pi ft \tag{1}$$

is impressed across one of the windings, and a voltage $$V_c = V\cos 2\pi ft \tag{2}$$

across the other winding, the voltage across the resolver rotor will be $$V_r = V(\sin\theta\cos 2\pi ft + \cos\theta\sin 2\pi ft) \tag{3}$$

where, V and $f$ are the amplitude and frequency of the excitation voltage respectively, $t$ is time, and $\theta$ is the mechanical angle of the output winding with respect to an input winding in radians.

Equation (3) reduces to $$V_r = V\sin(\theta + 2\pi ft) \tag{4}$$

which shows that the phase-shift angle of the alternating voltage $V_r$ relative to $V_s$ is equal to $\theta$.

The accuracy with which the angle $\theta$ can be determined is dependent to a great extent on the harmonic content of the excitation voltages $V_s$ and $V_c$, and it is desirable that any harmonics of the fundamental sinusoidal frequency component $f$ be of as high a frequency as possible and of low amplitude compared to the amplitude of the fundamental component.

The voltage generator which excites the resolver input windings comprises a clock generator means which produces accurately spaced pulses for both the voltage generator and receiver, an impedance element having first and second groups of sinusoidally distributed voltage taps, first counter means having an input coupled to the clock generator means, first switching means having an input terminal coupled to a first output of the first counter means and decoder means having an input coupled to a second output of the first counter means and a plurality of output terminals coupled respectively to the control terminals of a plurality of tap switches. Each of the tap switches has a first terminal coupled to a corresponding tap on the impedance element, a second terminal and a control terminal.

The first switching means is provided with first and second output terminals at which the state of the voltage reverses each time a pulse is received from the first counter means and third and fourth output terminals at which the state of the voltage reverses when every second pulse is received from the first counter means. The third and fourth terminals of the first switching means are coupled across the ends of the impedance element.

A switching circuit is also provided having first and second input terminals coupled to the second terminals of the tap switches associated with the first and second groups of taps respectively of the impedance element and third and fourth input terminals coupled to the first and second output terminals of the first switching means. First and second output terminals of the second switching means are coupled to the input windings of the resolver. The tap switches and switching circuit is defined herein as the second switching means.

In a preferred embodiment of the invention, the impedance element constitutes an autotransformer comprising a tapped coil wound on an iron core with an intermediate point grounded to provide a zero voltage reference. The first and second groups of taps are located on either side of this zero reference point and are distributed so that the voltage between each tap and ground represents a point on a sinusoidal voltage curve. The coil is energized by the voltages applied to its ends by the first switching means.

The decoder provides input signals to control terminals of the tap switches in each group causing them to conduct sequentially and, therefore, the voltages presented at the first and second input terminals of the second switching means comprise a series of steps approximating a sinusoidal waveform. It can be shown by a Fourier analysis that, with eight taps in each group, the voltages obtained in this way include a fundamental component and a series of harmonics, the order of the harmonics being represented by the expression $32n \pm 1$, where $n$ is an integer equal to or greater than one.

Thus, with eight taps per group, the lowest harmonic is the 31st followed by the 33rd, 63rd, 65th, 95th, etc, the amplitude of the $n$th harmonic being proportional to $1/n$. The voltages appearing at the taps of the impedance element and at the resolver stator windings are sinusoidally distributed step functions wherein the ratio of the harmonic components to the fundamental is so low that the resolver output voltage closely approaches that obtainable when a sinusoidal voltage having no low order harmonics is used to excite the resolver input windings. Increasing the number of taps per group will further increase the frequency and reduce the amplitude of the lowest harmonic component.

The receiver of the analog-digital converter system comprises means for comparing the phase of the voltage across the rotor winding with the phase of a reference signal, and provides a digital output proportional to this phase difference. More specifically, zero crossover detectors are coupled to the resolver rotor and a reference source (which may be a compensating winding of the resolver) to detect the instants at which the resolver rotor and reference voltages pass through zero. This phase difference is converted into a sum of clock pulses to provide a digital output proportional to the phase displacement between the resolver rotor and reference voltages and, therefore, the position of the resolver rotor shaft.

DESCRIPTION OF THE PREFERRED EMBODIMENT

Figure 1:
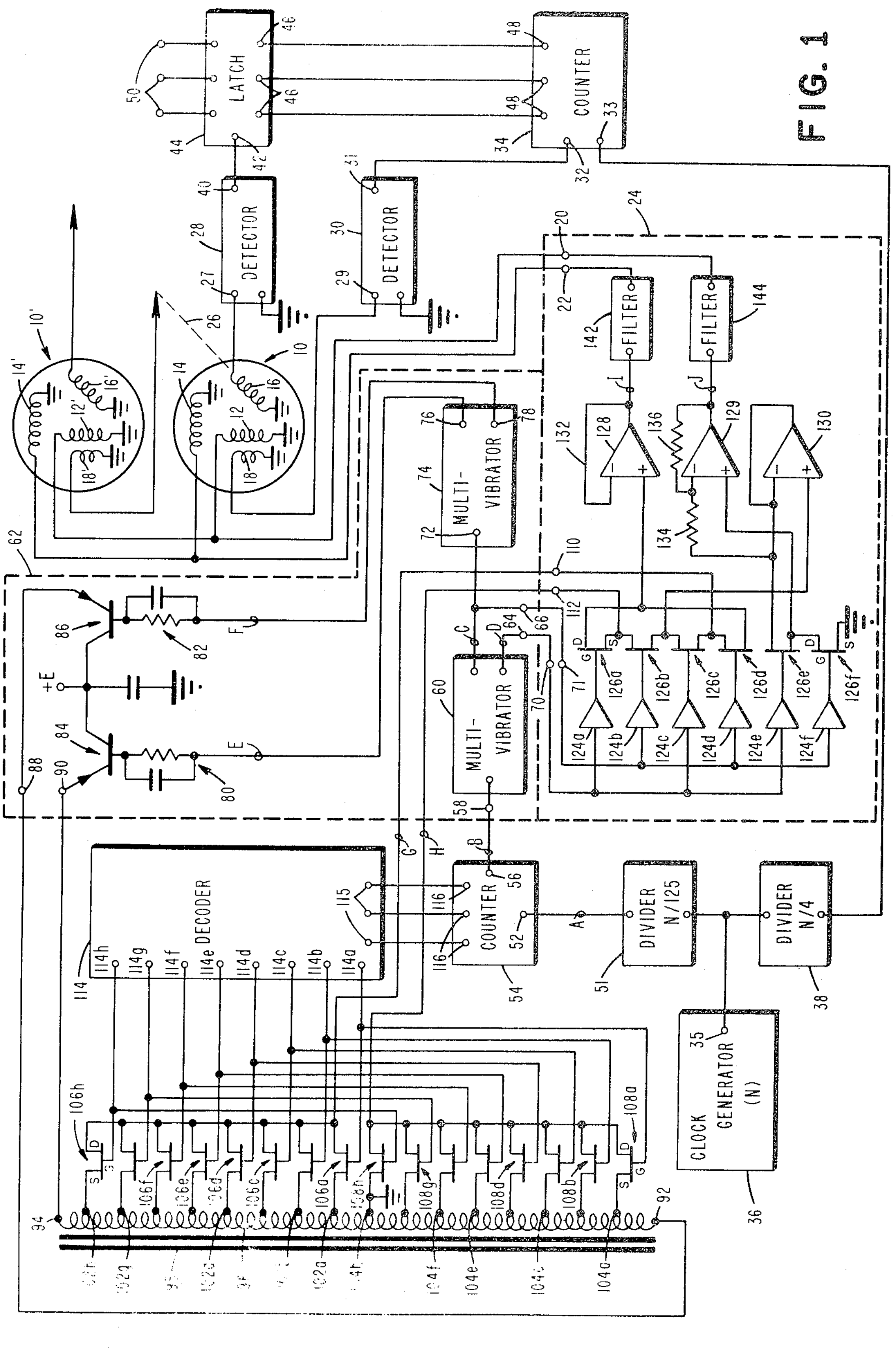
FIG. 1 is a schematic diagram of the analog-to-digital converter system of the present invention.

Referring to FIG. 1, there is shown a resolver 10 having reference input windings 12 and 14, a rotor winding 16 and a compensating winding 18. The reference windings 12 and 14 are each grounded at one end and connected at the other end to a pair of output terminals 20 and 22 in a switching unit 24. Switching unit 24 provides at terminals 20 and 22, as shall be explained hereinafter, excitation voltages which closely approximate sinusoidal and cosinusoidal waveforms.

The rotor winding 16, which is mechanically coupled to a shaft 26, is electrically connected to an input terminal 27 of a zero-crossing detector 28 and the output of the compensating winding 18 is applied to an input terminal 29 of a second zero-crossing detector 30. The resolver compensating winding 18 is used as the reference source since it provides a correction for phase shifts inherent in the resolver. Compensating windings are generally incorporated into precision resolvers but, if not avialable, the input of zero-crossing detector 30 may be connected to the ungrounded end of input winding 12. Then, in accordance with equation (4), the phase difference between the voltage at terminal 27 and the voltage at terminal 29, corresponds to the angular displacement of shaft 26.

The output terminal 31 of zero-crossing detector 30 is connected to the reset terminal 32 of a counter 34, the input terminal 33 of the counter being connected to the output terminal 35 of a clock generator 36 through a divider 38. Detector 30 applies a pulse to reset terminal 32 of counter 34 when the voltage across compensating winding 18 passes through zero causing the counter to shift to its zero position and start counting pulses received from divider 38 thereby generating a digital signal at output terminals 48.

The output terminal 40 of zero-crossing detector 28 is connected to an input terminal 42 of a bistable latch 44 which also receives at input terminals 46 the digital signals at terminals 48 of counter 34. Detector 28 applies a pulse to the input of latch 44 when the voltage across rotor winding 16 passes through zero. Bistable latch 44, acting as a temporary storage for the binary data provided by counter 34, transfers to output terminals 50 a binary signal signifying the number of pulses received at terminal 33 during the interval between a pulse from detector 30 and a pulse from detector 28. Thus, the binary information at terminals 50 corresponds to the phase difference between the voltage across rotor winding 16 and the voltage across compensating winding 18, as measured by clock pulses from clock generator 36 and divider 38, thereby providing an accurate indication of the angular position of shaft 26.

In a specific embodiment of the invention, the clock generator 36 provides pulses at a rate N of $1.6 \times 10^6$ pulses per second and divider 38 divides the pulse rate by 4 providing a counter input of $400 \times 10^3$ pulses per second. As shall be discussed hereinafter, the resolver input windings 12 and 14 are preferably excited by stepped voltages having a fundamental frequency of 400 hertz, a conventional frequency for resolvers of this type. Thus, counter 34 counts 1000 pulses per cycle, and thereby provides a high resolution indication of the angular position of resolver shaft 26.

The zero detectors, counter and latch, as well as all of the components designated by blocks in FIG. 1 are well known and commercially available and therefore no detailed description of their circuits will be provided.

Figure 2:
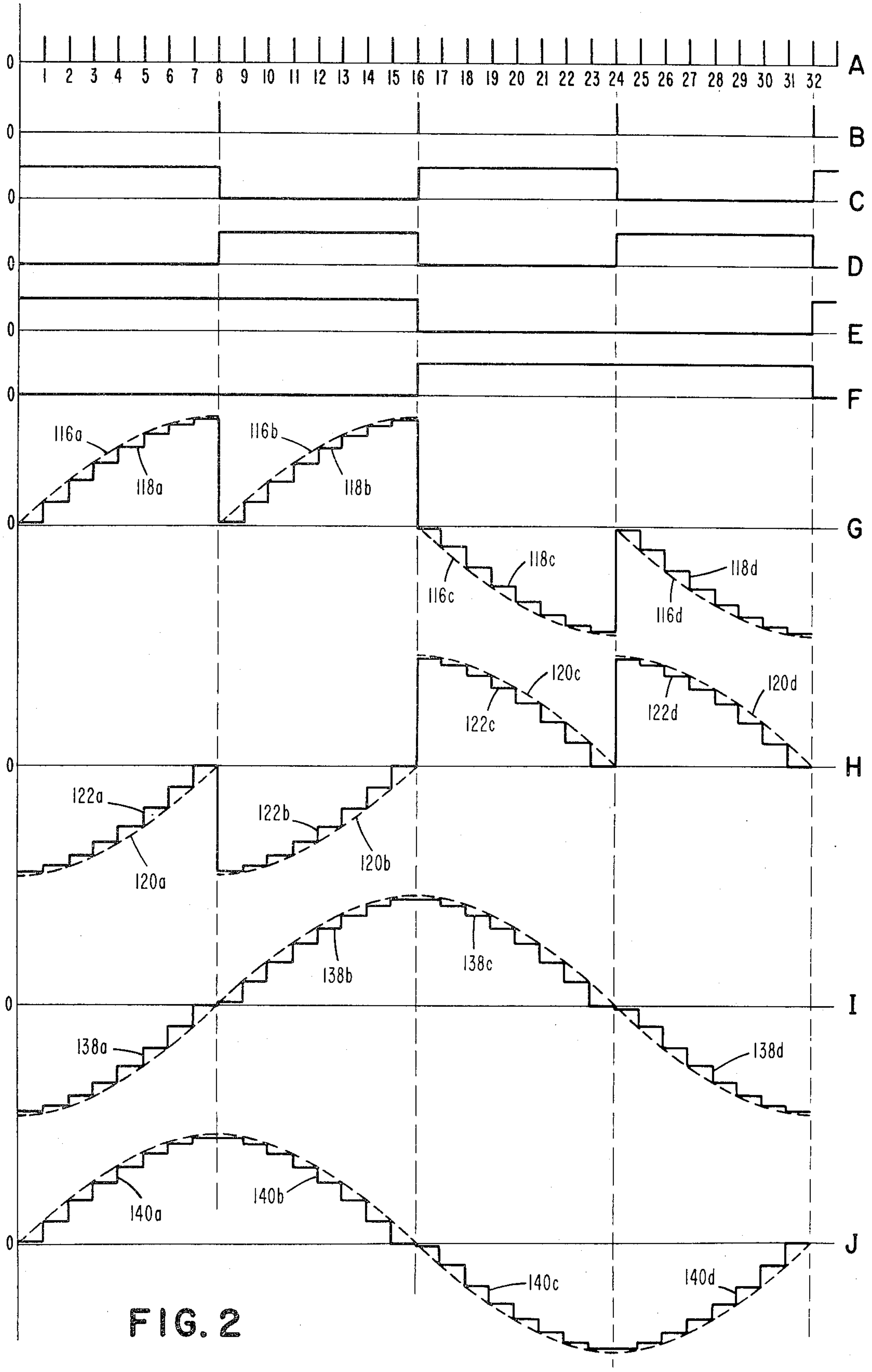
FIG. 2 shows waveforms representing the voltages at various parts of the system of FIG. 1.

In the following description of the circuits for generating the excitation voltages for resolver input windings 12 and 14, references will be made to the waveforms of FIG. 2 which are designated by the letters A to J corresponding to the voltages between correspondingly designated points in FIG. 1 and ground.

The output of clock generator 36 is coupled through a divider 51, which divides by 125, having its output connected to the input terminal 52 of a counter 54. Since clock generator 36 has a pulse repetition rate of $1.6 \times 10^6$ pulses per second and divider 51 divides this frequency by 125, the input to counter 54 (FIG. 2A) is 12,800 pulses per second. Assuming a frequency of 400 hertz, this means that each cycle consists of 32 pulses, as shown in FIG. 2A.

Counter 54 has a first output terminal 56 providing one pulse for every eight pulses at the input terminal 52 (FIG. 2B) and this output is coupled to an input terminal 58 of a switching unit 62. Specifically, terminal 58 is the input of a multivibrator 60, which is part of the switching unit 62. The outputs of multivibrator 60 are connected to output terminals 64 and 66 of unit 62, terminal 66 also being coupled to the input terminal 72 of a second multivibrator 74. Output terminals 76 and 78 of multivibrator 74 are coupled through biasing networks 80 and 82 respectively to the base electrodes of transistors 84 and 86. The collectors of these transistors are connected to a source of DC voltage, + E, and the emitters of the transistors through output terminals 88 and 90 of switching unit 62 to opposite ends 92 and 94 of a coil 96 wound on an iron core 98, coil 96 and core 98 functioning as an autotransformer. Winding 96 is provided with a first group of voltage taps 102*a*–102*b* and a second group of voltage taps 104*a*–104*h*, tap 104*h* being grounded. The taps 102*a*–102*h* and 104*a*–104*h* are located so that the voltage at each tap has a magnitude corresponding to a point on a sinusoidal voltage curve. Taps 102*a*–102*h* comprising the first group of taps are connected respectively to the source electrodes (S) of a corresponding group of field effect transistor (FET) 106*a*–106*h*. Taps 104*a*–104*h* comprising the second group of taps are connected respectively to the source electrodes of corresponding FET's 108*a*–108*h*. The drain electrodes (D) of FET's 106*a*–106*h* are connected to input terminal 110 of switching unit 24 and the drain electrodes of FET's 108*a*–108*h* are connected to input terminal 112 of unit 24. The source and drain electrodes of FET's 106*a*–106*h* and 108*a*–108*h* may be reversed without affecting circuit operation.

The gate electrodes (G) of FET's 106*a*–106*h* and 108*a*–108*h* are coupled respectively to the output terminals 114*a*–114*h* of a decoder 114 which accepts pulses at input terminals 115 from the output terminals 116 of counter 54. More specifically, output terminal 114*a* of decoder 114 is coupled to the gate electrodes of FET's 106*a* and 108*a*, terminal 114*b* to the gate electrodes of FET's 106*b* and 108*b*, etc. The output terminals 114*a*–114*h* are energized sequentially each time counter 54 receives a pulse from divider 51; thus, the first pulse from divider 51 causes counter 54 to apply a binary input to decoder 114 which results in FET's 106*a* and 108*a* being driven into conduction thereby coupling taps 102*a* and 104*a* to terminals 110 and 112 respectively. The next pulse from divider 51 updates the output of counter 54 by one binary bit switching the output of decoder 114 to terminal 114*b* driving FET's 106*b* and 108*b* into conduction coupling taps 102*b* and 104*b* to terminals 110 and 112. This process continues with each of the FET's 106*c*–106*h* and 108*c*–108*h* becoming conductive in turn thereby sequentially connecting taps 102*c*, 104*c*; 102*d*, 104*d*, . . . 102*h*, 104*h* to terminals 110 and 112. After eight counts, the decoder again gates on FET's 106*a* and 108*a* to couple taps 102*a* and 104*a* to terminals 110 and 112.

The voltages appearing at terminals 110 and 112 depend upon the voltages at the ends 94 and 92 of winding 96. These are determined by the transistor switches 84 and 86, which are controlled by the output voltages at terminals 76 and 78 of multivibrator 74. As shown in FIG. 2C, the input voltage to multivibrator 74 is a rectangular wave that is positive during each cycle for the intervals preceding the first eight pulses 1–8 and pulses 17–24 and zero for the intervals preceding pulses 9–16 and 25–32. The outputs of multivibrator 74, as shown in FIGS. 2E and 2F, have one-half the repetition rate of the input pulses to this multivibrator and drive transistor 84 into conduction during the first 16 pulse interval and transistor 86 into conduction during the second 16 pulse interval. As a result, during the first half of the cycle, the end 94 of coil 96 is driven positive by the voltage + E coupled to end 94 through transistor 84 which has been driven into conduction by the voltage on its base. Also during this interval, the end 92 of coil 96 is driven negative by transformer action to a voltage having a magnitude equal to that of end 94 but of opposite polarity. Similarly, during the second half of the cycle, transistor 86 is conductive, driving end 92 of coil 96 positive and by transformer action end 94 becomes negative.

The combination of the voltage applied across coil 96 by switching unit 62 and the switching between taps on coil 96 by decoder 114 produces the voltage waveform at terminal 110 shown in FIG. 2G and at terminal 112 shown in FIG. 2H. In FIG. 2G, each of the dashed lines 116*a*–116*d* represents a 90° segment or quadrant of a sinusoidal wave having a frequency corresponding to 32 pulses per cycle or 400 hertz. The solid lines 118*a*–118*d* represent the actual voltages appearing at terminal 110 due to the voltage between end 94 of coil 96 and ground and the switching by decoder 114 between taps 102*a*–102*h*. Similarly, in FIG. 2H, the dashed lines 120*a*–120*d* represent 90 ° segments or quadrants of a sinusoidal wave and the solid lines 122*a*–122*d* the actual voltages appearing at terminal 112. The voltage at terminal 112 is due to the voltage between end 92 of coil 96 and ground and the switching by decoder 114 between taps 104*a*–104 *h*.

In particular, during the first two quadrants, the voltage at end 94 of coil 96 is positive and decoder 114 gates FET's 106*a*–106*h* to switch from taps 102*a* to 102*h* producing a voltage at terminal 110 which increases in steps from zero toward + E as shown at 118*a* and 118*b* of FIG. 2G. Similarly, the voltage at end 92 of coil 96 is negative and decoder 114 gates FET's 108*a*–108*h* to switch from taps 104*a* to 104*h* producing a voltage at terminal 112 which increases in steps from a negative valve toward zero as shown at 122*a* and 122*b* of FIG. 2H. During the third and fourth quadrants, the voltage at end 94 of coil 96 is negative and therefore the voltages 118*c* and 118*d* of FIG. 2G decrease in steps from zero toward − E. Also, as shown in FIG. 2H the voltages 120*c* and 120*d* decrease in steps from a positive valve toward zero.

The switching unit 24, which receives the voltages of FIGS. 2G and 2H as input signals at terminals 110 and 112, comprises amplifiers 124*a*, 124*b*, 124*c*, 124*d*, 124*e* and 124*f* each having a corresponding FET 126*a*, 126*b*, 126*c*, 126*d*, 126*e* and 126*f* connected to its output. The inputs of amplifiers 124*a*, 124*c* and 124*e* are connected through input terminal 70 of unit 24 to output terminal 64 of switching unit 62 and the inputs of amplifiers 124*b*, 124*d* and 124*f* are connected through input terminal 71 of unit 24 to output terminal 66 of unit 62. Amplifiers 124*a*–124*f* apply positive voltages to the gates of FET's 126*a*–126*f* respectively with zero input voltage and a negative voltage to the gates when the input voltage to the amplifier is positive. The upper electrode of each of the FET's 126*a*–126*f* has been designated the drain (D) and the lower electrode the source (S), although these may be reversed as in the case of FET's 106*a*–106*h* and 108*a*–108*h*.

Operational amplifiers 128, 129 and 130, each having a pair of input terminals designated respectively (+) and (−), are also provided. The (+) input of amplifier 128 is coupled to the drain electrode of FET 126a and to the source electrode of FET 126d, the (−) input being coupled directly to the output of the amplifier by a lead 132.

The (+) input of amplifier 129 is coupled to the source and drain electrodes of FET's 126e and 126f respectively, the source electrode of FET 126f being grounded. The (−) input of amplifier 129 is connected through a resistor 134 to the drain electrode of FET 126e and to the (−) input and the output of amplifier 130. The (−) input of amplifier 129 is also coupled to the output of the amplifier through a resistor 136 having the same resistive value as resistor 134. The (+) input of amplifier 130 is connected to the source and drain electrodes of FET's 126b and 126c respectively. Also, terminal 110 is connected to the source and drain electrodes of FET's 126c and 126d, and terminal 112 is connected to the source and drain electrodes of FET's 126a and 126b.

During the first eight pulses applied to counter 54 (FIG. 2A) the voltage applied to the terminal 70 and the inputs of amplifiers 124a, 124c and 124e is zero as shown in FIG. 2D. Consequently, positive voltages are applied to the gates of FET's 126a, 126c and 126e causing these FET's to conduct. The voltage at terminal 112 (designated 122a in FIG. 2H) is applied to the connection between FET's 126a and 126b and appears at the (+) input of amplifier 128 since FET 126a is conducting and FET 126b is not. Thus, a voltage of the same polarity and waveform appears at the output of amplifier 128 as may be seen from a comparison of the voltage 138a in the first eight cycles of FIG. 2I and voltage 122a in the first eight cycles of FIG. 2H. Similarly, during pulses 17–24, when amplifiers 124a, 124c and 124e are again energized, the voltage 138c at the output of amplifier 128 (FIG. 2I) corresponds to that during this portion of the cycle as shown at 122c in FIG. 2H.

The voltage applied to terminal 110 during the first eight pulse counts (designated 118a in FIG. 2G) is coupled through conducting FET 126c to the (+) input of amplifier 130 and appears at its (−) input with the same magnitude and polarity. FET 126e is also conductive resulting in the voltage at terminal 110 being applied to the input of resistor 134 and to the (+) terminal of operational amplifier 129. Consequently, the voltage at the output of amplifier 129, as shown at 140a in FIG. 2J, is the same as at 118a in FIG. 2G. Similarly, during the portion of the cycle corresponding to pulses 17–24, voltage 140c shown in FIG. 2J corresponds to voltage 118c in FIG. 2G.

During the second and fourth quarters of the cycle represented by pulses 9–16 and 25–32, amplifiers 124b, 124d and 124f have zero input applied through terminal 71 by multivibrator 60 (FIG. 2C) and therefore FET's 126b, 126d and 126f become conductive. During these portions of the cycle, the voltages at terminal 110 (118b and 118d in FIG. 2G) are applied to the (+) input of amplifier 128 through FET 126d and therefore appears at the output of this amplifier as shown at 138b and 138d in FIG. 2I.

The voltages (122b and 122d in FIG. 2H) at input terminal 112 are coupled during the second and fourth quarters of the cycle to the (+) input of amplifier 130 through FET 126b and therefore also appear at its (−) input and are coupled through resistor 134 to the (−) input of amplifier 129. Also, since FET 126f is conductive during this portion of the cycle, the (+) input of amplifier 129 is grounded. Accordingly, the output of operational amplifier 129 is the negative of the voltage applied to terminal 112 as shown by a comparison of voltages 122b and 122d of FIG. 2H and 140b and 140d of FIG. 2J during the pulse intervals 9–16 and 25–32.

As a result, the output 138a–138d of amplifier 128 shown in FIG. 2I provides an approximation to a cosinusoidal voltage. Although the stepped voltage 138a–138d is not cosinusoidal, it is an excellent approximation thereto because it consists primarily of a fundamental component at 400 hertz with the lowest harmonic being the 31st at a frequency of 12,400 hertz and an amplitude 1/31 of the fundamental. The harmonics in this voltage may be further reduced by a filter 142, the output of the filter 142 being applied via terminal 22 to input winding 14 of resolver 10. Similarly, the sinusoidal output of amplifier 129 (FIG. 2J) is coupled through a filter 144, which further reduces the harmonic content of the voltage, via terminal 20 to input winding 12 of resolver 10.

Summarizing, although the voltages applied to the input windings 12 and 14 of resolver 10 are stepped approximations to sinusoids, they nevertheless provide a digital output having excellent accuracy. By recognizing that the disclosed approximation to a sinusoidal voltage has a low harmonic content, the present invention makes it unnecessary to generate a pure sinusoidal voltage to achieve a high resolution measurement of the position of the resolver shaft.

It is also possible to drive a large number of resolvers by merely coupling them, in parallel with resolver 10, to terminals 22 and 20. One such resolver is shown at 10' with its output windings 12' and 14' coupled to terminals 20 and 22 respectively. The rotor 16' and compensating winding 18' are coupled to zero detectors, counters and latch circuits (not shown) associated with the resolver 10' in the same way as detectors 28 and 30, counter 34 and latch 44 are connected to rotor 16 and compensating winding 18.

What is claimed is:

1. A signal synthesizer for producing a stepped voltage having a fundamental sinusoidal frequency component and low harmonic content comprising:

an impedance element having at least one group of spaced taps thereon, first switching means connected to said impedance element for coupling a reference voltage of selected polarity and constant value across said group of spaced taps, said taps being positioned on said impedance element to provide a voltage at each tap which is a sinusoidal function of said position with respect to a tap maintained at a fixed potential, and second switching means connected to said impedance element and having an output terminal, said second switching means coupling sequentially the taps on said impedance element to said output terminal between each reversal by said first switching means of the polarity of said reference voltage to provide between each of said polarity reversals a stepped voltage at said output terminal corresponding to a half-cycle of said fundamental sinusoidal component.

2. A signal synthesizer as defined by claim 1 wherein said impedance element has two groups of spaced taps, and said second switching means has first and second output terminals and is coupled to said first and second group of taps, stepped voltages in phase quadrature with each other being coupled to said first and second output terminals.

3. A signal synthesizer as defined by claim 1 wherein said impedance element is an autotransformer having a tapped coil.

4. A signal synthesizer as defined by claim 2 wherein there are eight taps in each of said groups.

5. Apparatus including an electromagnetic transducer having first and second reference windings, a signal synthesizer for providing stepped voltages to said first and second reference windings, said voltages having fundamental sinusoidal frequency components in phase quadrature with respect to each other and low harmonic content, comprising:

an impedance element having first and second ends and having at least first and second groups of spaced taps thereon, first switching means connected to said impedance element for alternately connecting reference voltages of opposite polarity and constant value across said first and second groups of spaced taps, said taps being located on said impedance element to provide a voltage at each tap within a group which is a sinusoidal function of said location with respect to a tap maintained at a fixed potential, second switching means connected to said impedance element and having first and second output terminals, said second switching means coupling sequentially and selectively the taps in each of said first and second groups respectively to said first and second output terminals to provide stepped output voltages thereof, said voltages having fundamental sinusoidal components in phase quadrature with each other, and means coupling the first and second output terminals of said second switching means to the first and second input windings of said transducer respectively.

6. Apparatus as defined by claim 5 wherein said impedance element is an autotransformer having a tapped coil, said first and second groups of taps being located between said first and second ends of said coil respectively and an intermediate reference point, said first switching means coupling a reference voltage to one polarity between the first end of said coil and said reference point and a voltage of opposite polarity between the second end of said coil and said reference point.

7. Apparatus as defined by claim 5 wherein said second switching means includes first and second groups of tap switches each having a first terminal, a second terminal and a control terminal, the first terminal of each of the switches in said first and second groups being coupled to a corresponding tap in said first and second groups of spaced taps respectively; and a switching circuit having a first input terminal coupled to the second terminals of said first group of tap switches and a second input terminal coupled to the second terminals of said second group of tap switches.

8. Apparatus as defined by claim 7 which further comprises:

a clock generator for generating pulses, a counter having an input coupled to said clock generator and a first output coupled to said first switching means, said counter resetting after receiving a predetermined number of pulses from said clock generator, and a decoder having an input coupled to a second output of said counter and a plurality of output terminals, each of said output terminals being coupled to the control terminals of a corresponding tap switch in said first and second groups, said decoder energizing sequentially said tap switches in accordance with pulses received by said counter means from said clock generator.

9. Apparatus as defined by claim 8 wherein said first switching means further comprises an input terminal and first, second, third and fourth output terminals, a first multivibrator having an input coupled to the input terminal of said first switching means and a pair of outputs coupled to said first and second output terminals of said first switching means, said first multivibrator receiving a pulse each time said counter resets and reversing the states of the voltages at its first and second outputs, a second multivibrator having an input coupled to an output of said first multivibrator and a pair of outputs, said second multivibrator reversing the states of the voltages at its outputs for every second pulse received by said first multivibrator, and first and second switching elements each having an input coupled to a corresponding output of said second multivibrator and an output coupled to said third and fourth output terminals of said first switching means and to a corresponding end of said impedance element, said first and second switching elements being driven alternately into conduction each time the output of said second multivibrator changes states.

10. Apparatus as defined by claim 7 wherein said switching circuit comprises means coupling the voltages at the first and second input terminals of said switching circuit during the first and third quadrants of each cycle of said fundamental sinusoidal frequency component to the first and second output terminals respectively of said second switching means, and means coupling the voltages at the first input terminal of said switching circuit during the second and fourth quadrants of each cycle of said fundamental sinusoidal frequency component to the second output terminal of said second switching means, and means coupling the negative of the voltage at the second input terminal of said second switching circuit during the second and fourth quadrants of each cycle of said fundamental sinusoidal frequency component to the first output terminal of said second switching means.

11. Apparatus as defined by claim 7 wherein there are eight taps in each of said groups.

* * * * *